United States Patent
Amano (10) Patent No.: US 11,018,404 B2
(45) Date of Patent: May 25, 2021

(54) CIRCUIT BODY STRUCTURE, WHERE PLANAR CONDUCTORS ON DIFFERENT LAYERS OF A MULTILAYER BOARD ARE CONNECTED BY AN INTERLAYERS CONNECTION

(71) Applicant: NEC Space Technologies, Ltd., Tokyo (JP)

(72) Inventor: Osamu Amano, Tokyo (JP)

(73) Assignee: NEC SPACE TECHNOLOGIES, LTD., Tokyo (JP)

( * ) Notice: Subject to any disclaimer, the term of this patent is extended or adjusted under 35 U.S.C. 154(b) by 494 days.

(21) Appl. No.: 15/746,876

(22) PCT Filed: Aug. 17, 2016

(86) PCT No.: PCT/JP2016/003753
§ 371 (c)(1),
(2) Date: Jan. 23, 2018

(87) PCT Pub. No.: WO2017/033434
PCT Pub. Date: Mar. 2, 2017

(65) Prior Publication Data
US 2020/0112076 A1 Apr. 9, 2020

(30) Foreign Application Priority Data
Aug. 26, 2015 (JP) .............................. JP2015-166912

(51) Int. Cl.
*H01P 5/02* (2006.01)
*G01R 1/04* (2006.01)
(Continued)

(52) U.S. Cl.
CPC ............ *H01P 5/028* (2013.01); *G01R 1/0441* (2013.01); *H01P 3/085* (2013.01); *H01P 3/088* (2013.01); *H05K 1/02* (2013.01); *H05K 3/46* (2013.01)

(58) Field of Classification Search
CPC ........... H01P 5/028; H01P 3/082; H01P 3/088
(Continued)

(56) References Cited

U.S. PATENT DOCUMENTS 5,917,388 A * 6/1999 Tronche et al. ........ H01L 23/66
29/600
9,627,736 B1 * 4/2017 Ingalls ..................... H01P 5/02
(Continued)

FOREIGN PATENT DOCUMENTS

JP S63-158004 U 10/1988
JP H04-802 A 1/1992
(Continued)

OTHER PUBLICATIONS

Extended European Search Report for EP Application No. EP16838785.0 dated Mar. 20, 2019.
(Continued)

*Primary Examiner* — Benny T Lee (57) ABSTRACT
Provided is a circuit structural body is formed into a shape including: A circuit structural body, including: a multilayer board, which includes a plurality of layers of a first to N-th tri-plate structural bodies each including a first to N-th (N is an integer of 2 or more) planar conductors; an interlayers connection conductor, which is configured to connect the first to N-th planar conductors to each other; and a side-surface ground conductor, which is formed on a side surface of the multilayer board, and is approximately parallel to and near the interlayers connection conductor.

4 Claims, 5 Drawing Sheets

(51) Int. Cl.
*H01P 3/08* (2006.01)
*H05K 1/02* (2006.01)
*H05K 3/46* (2006.01)

(58) Field of Classification Search
USPC .................................................. 333/33, 246
See application file for complete search history.

(56) References Cited

U.S. PATENT DOCUMENTS

2010/0052821 A1    3/2010  Kushta
2015/0230330 A1*   8/2015  Lee et al. ............... H01P 5/028
                                                     174/261

FOREIGN PATENT DOCUMENTS

| JP | H11-243281 A  | 9/1999 |
| JP | 2001-189609 A | 7/2001 |
| JP | 2001-313505 A | 11/2001 |
| JP | 2002-100901 A | 4/2002 |
| JP | 2003-168903 A | 6/2003 |
| JP | 2004-087563 A | 3/2004 |
| JP | 2004-259959 A | 9/2004 |
| JP | 2006-246189 A | 9/2006 |
| JP | 2009-111658 A | 5/2009 |
| JP | 2010-520652 A | 6/2010 |
| JP | 2013-005296 A | 1/2013 |

OTHER PUBLICATIONS

Japanese Office Action for JP Application No. 2015-166912 dated Jul. 13, 2016 with English Translation.
International Search Report for PCT Application No. PCT/JP2016/003753, dated Nov. 1st, 2016.
English translation of Written opinion for PCT Application No. PCT/JP2016/003753, dated Nov. 1, 2016.

* cited by examiner

CIRCUIT BODY STRUCTURE, WHERE PLANAR CONDUCTORS ON DIFFERENT LAYERS OF A MULTILAYER BOARD ARE CONNECTED BY AN INTERLAYERS CONNECTION

CROSS-REFERENCE TO RELATED APPLICATIONS

This is a national stage of International Application No. PCT/JP2016/003753 filed on Aug. 17, 2016, claiming priority based on Japanese Patent Application No. 2015-166912 filed on Aug. 26, 2015, the entire contents of which are incorporated herein by reference.

TECHNICAL FIELD

This invention relates to a circuit structure of a multilayer board forming a high frequency circuit, and more particularly, to a circuit structural body having a tri-plate structure formed in multilayers.

BACKGROUND ART

A tri-plate structure is employed in a high frequency circuit in many cases. Further, structures forming a tri-plate line of a tri-plate structure by using each layer of a multilayer board have been proposed.

The tri-plate structure is described in, for example, Patent Document 1 and Patent Document 2.

In Patent Document 1, there is described a board-to-board connection element of tri-plate stripline type in which the tri-plate structures are joined to each other. In the board-to-board connection element of tri-plate stripline type, the strip conductors respectively formed between a first layer and a second layer and between a third layer and a fourth layer of a multilayer board formed by four layers are joined to each other by through-hole plating (via).

Further, in Patent Document 2, there is disclosed a tri-plate line interlayer connector (structure) between a first tri-plate line and a second tri-plate line.

PRIOR ART DOCUMENTS

Patent Document

Patent Document 1: JP S63-158004 U
Patent Document 2: JP 2013-05296 A

SUMMARY OF THE INVENTION

Problem to be Solved by the Invention

The tri-plate structure employing the multilayer board is used in various high frequency circuits.

Further, there are a wide variety of demands required for the high frequency circuit. Among those demands, for example, a demand for a narrowed distance between elements has increased in order to achieve functionality of a microstrip antenna at a wider range of frequencies. Recently, there has been increased a demand for a high frequency circuit supporting parallel feeding in addition to series feeding to a related-art microstrip antenna. This increasing demand also leads to the demand for the narrowed distance between elements. Further, for example, when the number of layers is further increased in the multilayer board, much more space is required for a connection in order to connect the lines in different layers to each other. As a result, along with the increase in number of layers of the board, a variety of constraints on design and manufacture will also greatly affect the size or the area the tri-plate structure will occupy.

For example, in the board-to-board connection element of tri-plate stripline type as described in Patent Document 1, it is difficult to uniformly join the tri-plate structures of two or more layers.

Further, in the description of the tri-plate structure in Patent Document 2, there is no disclosure of a structure and a method in which tri-plate structures of two or more layers are included, and the tri-plate lines are connected to each other by a conductor.

Further, as a component of the tri-plate structure, there is a case in which a component for suppressing energy loss is required to appropriately be provided. The inventor of this invention assumes that such a component is also required for the circuit structure in which the tri-plate lines in the different layers are connected to each other by the conductor in the multilayer board structure having the plurality of tri-plate structures.

In Patent Document 1, it is not disclosed that a through hole is used for connecting the tri-plate lines of the plurality of layers. Further, in Patent Document 2, the component for connecting the tri-plate lines to each other by the conductor is not disclosed, and the component thereof is not assumed.

This invention has been made based on the above-mentioned assumptions, and provides a circuit structural body with a circuit structure which includes a plurality of planar conductors having tri-plate structures in different layers of a multilayer board, and being connected to each other by a conductor, the circuit structural body occupying a small area and maintaining good circuit characteristics.

Means to Solve the Problem

According to one embodiment of this invention, there is provided a circuit structural body, including:

a multilayer board, which includes a plurality of layers of a first to N-th tri-plate structural bodies each including a first to N-th (N is an integer of 2 or more) planar conductors;

an interlayers connection conductor, which is configured to connect the first to N-th planar conductors to each other; and a side-surface ground conductor, which is formed on a near side surface to the interlayers connection conductor of the multilayer board, and is approximately parallel to the interlayers connection conductor.

Effect of the Invention

According to this invention, it is possible to provide the circuit structural body with the circuit structure which includes the plurality of planar conductors having the tri-plate structures in the different layers of the multilayer board, and being connected to each other by the conductor, the circuit structural body occupying a small area and maintaining good circuit characteristics.

DETAIL DESCRIPTION OF THE INVENTION

With reference to the drawings, descriptions are made of embodiments of this invention where like features are denoted by the same reference numbers and the same descriptive wording.

Figure 1A:
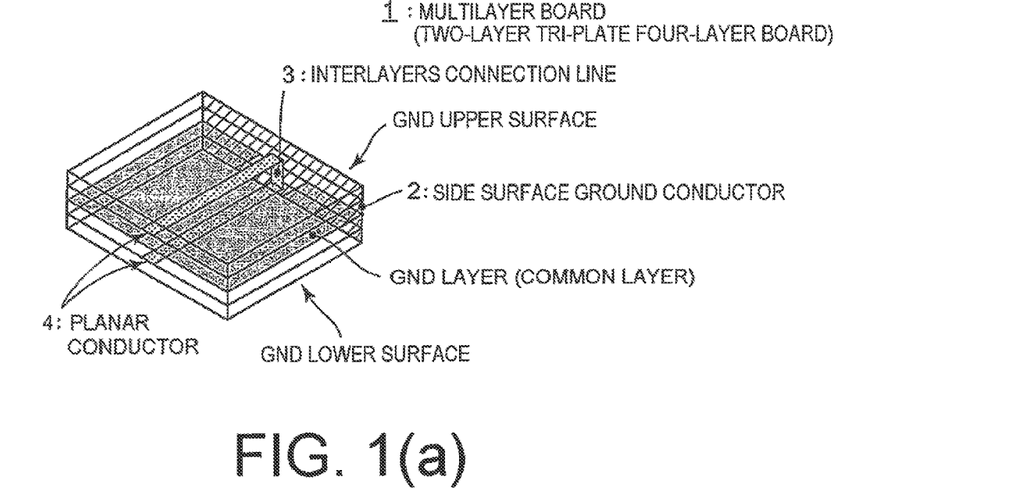
FIG. 1(a), FIG. 1(b), FIG. 1(c) and FIG. 1(d) are explanatory views for illustrating a circuit structural body according to an embodiment of this invention.
Figures 1B, 1C:
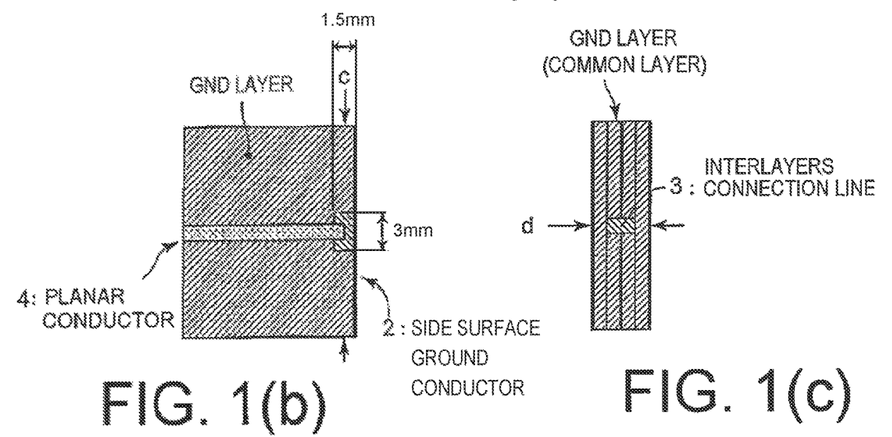
Figure 1D:
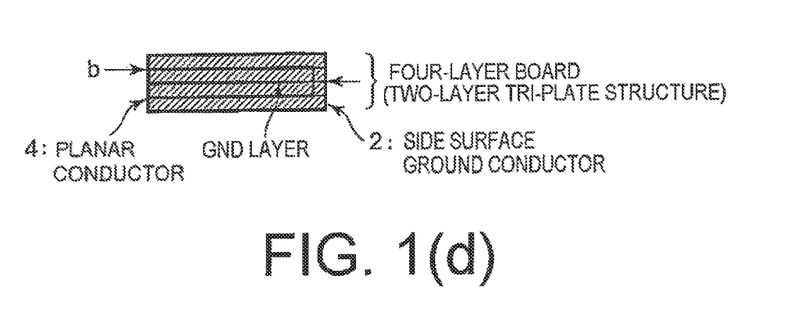

FIG. 1(a) to FIG. 1(d) are explanatory views for illustrating a circuit structural body according to an embodiment of this invention. FIG. 1(a) is a perspective view for illustrating a four-layer board including two-layer tri-plate structures. FIG. 1(b) to FIG. 1(d) are sectional views in three directions where a distance c is depicted in FIG. 1(b), a distance d is depicted in FIG. 1(c) and a distance b is depicted in FIG. 1(d).

In this embodiment, a broadband line of a parallel-plate transmission line is formed on the two-layer tri-plate four-layer board. The line can be used as a power supply circuit for an antenna or a high frequency circuit.

In a multilayer board 1 serving as the tri-plate structural bodies in the two layers, a planar conductor and a ground conductor surface that forms a tri-plate line are formed in respective layers. Further, in the multilayer board 1 (two-layer tri-plate four-layer board), a side surface ground conductor 2 is formed on a side surface (depth side surface of FIG. 1(a)).

The side surface ground conductor 2 which is formed in the multilayer board 1 is maintained to have a relationship approximately parallel to an interlayers connection conductor 3 described later. The side surface ground conductor 2 may be formed so as to cover the entire side surface, or may be formed around portions of the interlayers connection conductor 3. It is desired that the side surface ground conductor 2 at least have a size large enough to cover a projected portion which is formed when the interlayers connection conductor 3 is projected on the side surface.

In an inner layer of the multilayer board 1, a plurality of stripline (planar conductors) 4, hereinafter referred to as "planar conductor(s)", serving as the tri-plate lines are formed. The planar conductors 4 in respective layers are connected to each other via the interlayers connection conductor 3.

In the following description, the planar conductor 4 on an upper side in the drawings is referred to as an "upper tri-plate line conductor", the planar conductor 4 on a lower side in the drawings is referred to as a "lower tri-plate line conductor", and the interlayers connection conductor 3 is referred to as an "interlayers connection line".

The interlayers connection conductor 3 plays a role of connecting the planar conductors 4 (upper tri-plate line conductor and lower tri-plate line conductor) which are formed in different layers of the multilayer board 1 to each other while maintaining a high frequency characteristic.

In this embodiment, one ground conductor layer, in which a portion corresponding to the interlayers connection conductor 3 is excluded, is formed in a layer between the second layer and the third layer of the multilayer board 1 (in a layer between the plurality of planar conductors 4 serving as the tri-plate line conductors). The common ground conductor layer is used in both the upper tri-plate structure and the lower tri-plate structure as the ground conductor surface. In the following description, the ground conductor surface used in common is referred to as an "intermediate ground conductor surface" or "ground layer (common layer)". For example, in FIGS. 1(a) and 2(a), the ground layer (common layer) may be the lower ground surface of an upper tri-plate structure or the upper ground surface of a lower tri-plate structure. The circuit structure portion may be formed so that each tri-plate structure separately has an upper ground conductor surface for the upper tri-plate structure (labeled "GND upper surface" in FIGS. 1(a) and 2(a)) and a lower ground conductor surface for the lower tri-plate structure (labeled "GND lower surface" in FIGS. 1(a) and 2(a)) without using the intermediate ground conductor surface.

In this embodiment, the interlayers connection conductor 3 is formed as a planar conductor. The interlayers connection conductor 3 is formed into a shape that achieves impedance matching with the planar conductors 4 serving as the tri-plate lines. The interlayers connection conductor 3 may be formed by mounting a conductive material, or may be formed by filling a conductive material, for example, using a via.

It is desired that a distance between the ground conductor 2 formed on the side surface of the multilayer board 1 and the interlayers connection conductor 3 be a distance smaller than half (½) a distance between the intermediate ground conductor surface and surface ground conductor surfaces (upper surface ground conductor and lower surface ground conductor) to be formed on the multilayer board 1. Preferably, it is desired that the distance be approximately three quarters (¾) of a single layer. In other words, it is desired that the distance be equal to or smaller than a distance between the tri-plate lines forming the tri-plate structures and both the respective ground conductor surfaces.

In this manner, there is formed the circuit structure which includes the plurality of planar conductors having the tri-plate structure in the different layers of the multilayer board and being connected to each other by the conductor.

As for the relationship of components of the circuit structural body at this time, the side surface ground conductor is formed on the side surface of the board at a position at which the side surface ground conductor has an optimum positional relationship with the interlayers connection conductor for the high frequency circuit. With this structure, it is possible to secure waveguides of the different tri-plate structures while saving space and maintaining circuit function. Further, it is possible to optimally design dimensions of a cutout formed in the intermediate ground conductor surface, to thereby achieve further space saving.

That is, according to this embodiment, it is possible to provide the circuit structural body with the circuit structure which includes the plurality of planar conductors having the tri-plate structure in the different layers of the multilayer board, and being connected to each other by the conductor, the circuit structural body occupying a small area and maintaining good circuit characteristics.

Next, another embodiment of this invention is described. In the description of this embodiment, the same parts as in the above-mentioned embodiment are simplified or omitted.

Figure 2A:
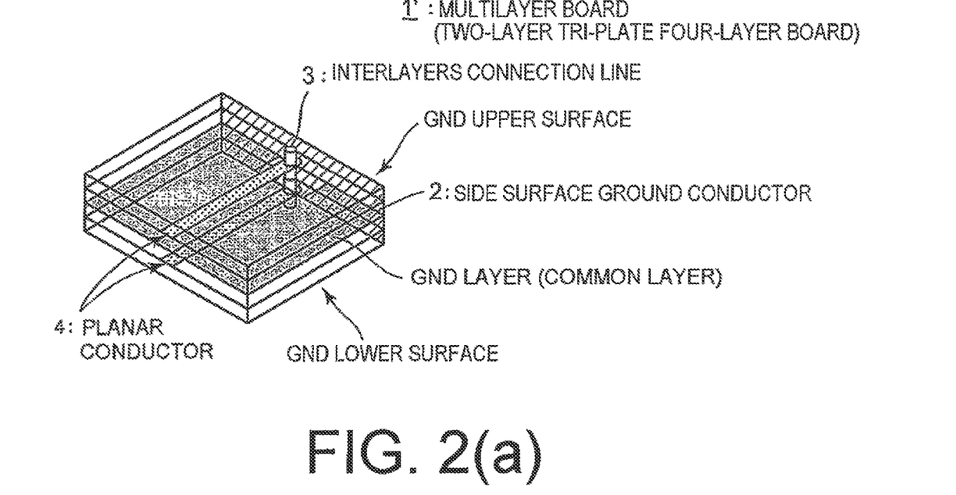
FIG. 2(a), FIG. 2(b), FIG. 2(c) and FIG. 2(d) are explanatory views for illustrating a circuit structural body according to another embodiment of this invention.
Figures 2B, 2C:
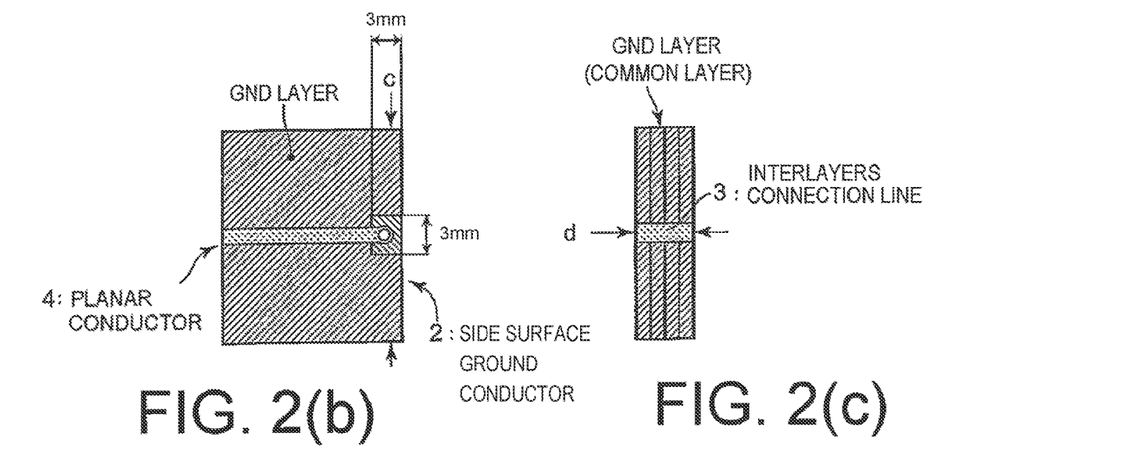
Figure 2D:
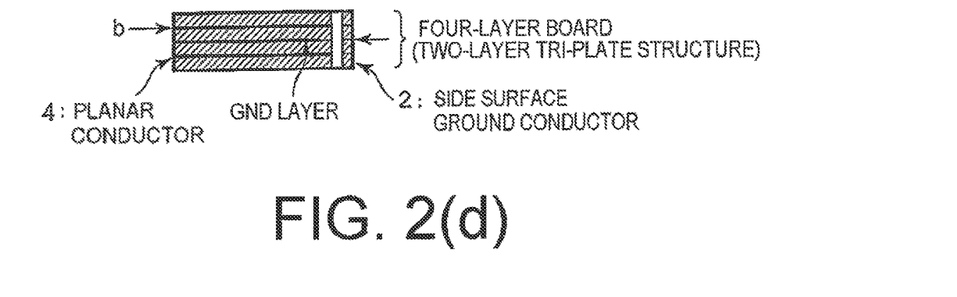

FIG. 2(a) to FIG. 2(d) are explanatory views for illustrating a circuit structural body of another embodiment. FIG. 2(a) is a perspective view for illustrating a four-layer board having a two-layer tri-plate structure. FIG. 2(b) to FIG. 2(d) are sectional views in the three directions where a distance c is depicted in FIG. 2(b), a distance d is depicted in FIG. 2(c) and a distance b is depicted in FIG. 2(d). The circuit structural body illustrated in FIG. 2(a) to FIG. 2(d) is different from the circuit structural body illustrated in FIG. 1(a) to FIG. 1(d) in that the interlayers connection conductor 3 is formed of a through hole.

As illustrated in FIG. 2(a) to FIG. 2(d), the interlayers connection conductor 3 is a cylindrical (columnar) through hole. Further, the interlayers connection conductor 3 may be formed in the inner layer of the multilayer board as a cylindrical (columnar) via.

In a multilayer board 1', similarly to the above-mentioned embodiment, the tri-plate line of the parallel-plate transmission mode and the ground conductor surfaces are formed in respective layers, and the ground conductor 2 is formed on a side surface (depth side surface of FIG. 2(a)). The ground conductor 2 has a relationship of being approximately parallel to the interlayers connection conductor 3.

In this manner, there is formed the circuit structure which includes the plurality of planar conductors having the tri-plate structure in the different layers of the multilayer board, and being connected to each other by the conductor. Here, the ground conductor is formed on the side surface at a position at which the ground conductor has an optimum positional relationship with the conductor, which connects the tri-plate lines to each other, for the high frequency circuit. With this structure, it is possible to secure waveguides of the different tri-plate structures while saving space and maintaining circuit function. Further, it is possible to optimally design dimensions of a cutout formed in the intermediate ground conductor surface, to thereby achieve further space saving.

That is, according to this embodiment, it is possible to provide the circuit structural body with the circuit structure which includes the plurality of planar conductors having the tri-plate structure in the different layers of the multilayer board, and being connected to each other by the conductor, the circuit structural body occupying a small area and maintaining good circuit characteristics.

Now, an advantage of this invention is described by taking an example of the two-layer tri-plate four-layer board in which the tri-plate lines are joined to each other with the through hole.

Figure 3A:
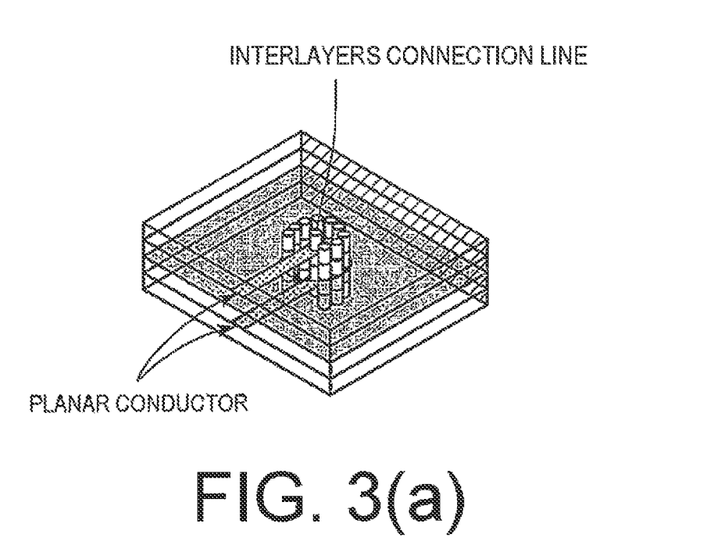
FIG. 3(a) and FIG. 3(b) are explanatory views for illustrating a circuit structural body for comparison to this invention.
Figure 3B:
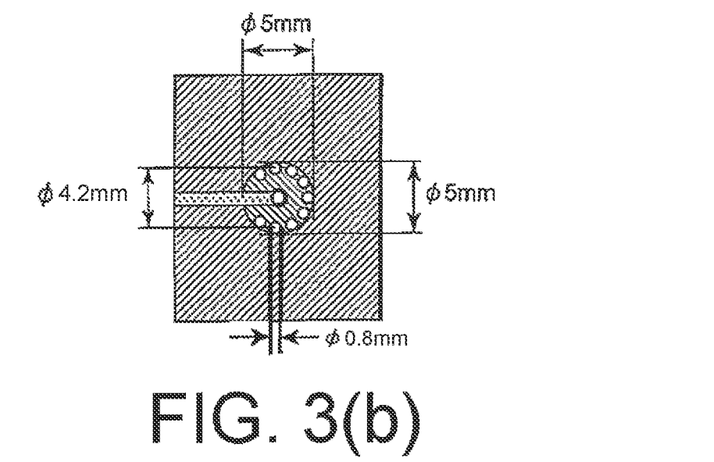

FIG. 3(a) and FIG. 3(b) includes explanatory views for illustrating a circuit structural body for comparison to this invention. In the interlayers connection circuit, interlayers connection is performed between the tri-plate lines near the center of the board through use of a number of through holes.

As illustrated in FIG. 3(a) and FIG. 3(b), when a plurality of layers of the tri-plate structures are provided, the tri-plate lines are connected to each other and the region around the connection portion of the tri-plate lines is surrounded by the other through holes. With this structure, it is possible to incorporate the connection between the layers and the component configured to suppress energy loss into the circuit structure.

In the circuit structure, it is possible to point out problems in that the region surrounded by the through holes and an appropriate distance between the other circuit elements are required, and that the formation of the through holes becomes more difficult as the number of layers is increased. Further, when the number of layers is further increased, a constraint preventing damage in the wirings, with respect to the upper and lower layers, may largely affect the design. In other words, it is possible to point out a problem in efficiency of providing each circuit element in a small region while maintaining the high frequency characteristic even when the number of layers is increased.

Meanwhile, in the circuit structure according to the invention of the present application, the ground conductor provided to a wall surface of the multilayer board is formed to maintain a positional relationship of being an approximately parallel surface to the interlayers connection conductor. As a result, it is possible to achieve the space saving while maintaining the high frequency characteristic. In other words, when the circuit structures illustrated in FIG. 1(a) to FIG. 1(d) and FIG. 2(a) to FIG. 2(d), and the circuit structure illustrated in FIG. 3(a) and FIG. 3(b) are formed in the multilayer board while maintaining the high frequency characteristics to be equal, the circuit structures illustrated in FIG. 1(a) to FIG. 1(d) and FIG. 2(a) to FIG. 2(d) may be designed in a more space-saving manner. Further, the circuit structures illustrated in FIG. 1(a) to FIG. 1(d) and FIG. 2(a) to FIG. 2(d) may contribute to a decrease in number of the through holes.

In the following, description is made of an example of describing the dimensions and the number of through holes, which are required for the circuit structures illustrated in FIG. 1(a) to FIG. 1(d) and FIG. 2(a) to FIG. 2(d) that may have the equivalent characteristic and the circuit structure illustrated in FIG. 3(a) and FIG. 3(b), in a comparing manner.

Dimensions:
Circuit structure of FIG. 3(a) and FIG. 3(b): y 4.2 mm of through hole center (outermost diameter: φ5 mm in FIG. 3(b))
Circuit structure of FIG. 1(a) to FIG. 1(d): 3 mm (in a vertical direction of FIG. 1(b))×1.5 mm (in a horizontal direction of FIG. 1(b))
Circuit structure of FIG. 2(a) to FIG. 2(d): 3 mm×3 mm (in FIG. 2(b))
Number of through holes:
Circuit structure of FIG. 3(a) and FIG. 3(b): 9 (through hole diameter: φ0.8 mm in FIG. 3 (b))
Circuit structure of FIG. 1(a) to FIG. 1(d): 0
Circuit structure of FIG. 2(a) to FIG. 2(d): 1

Figure 4A:
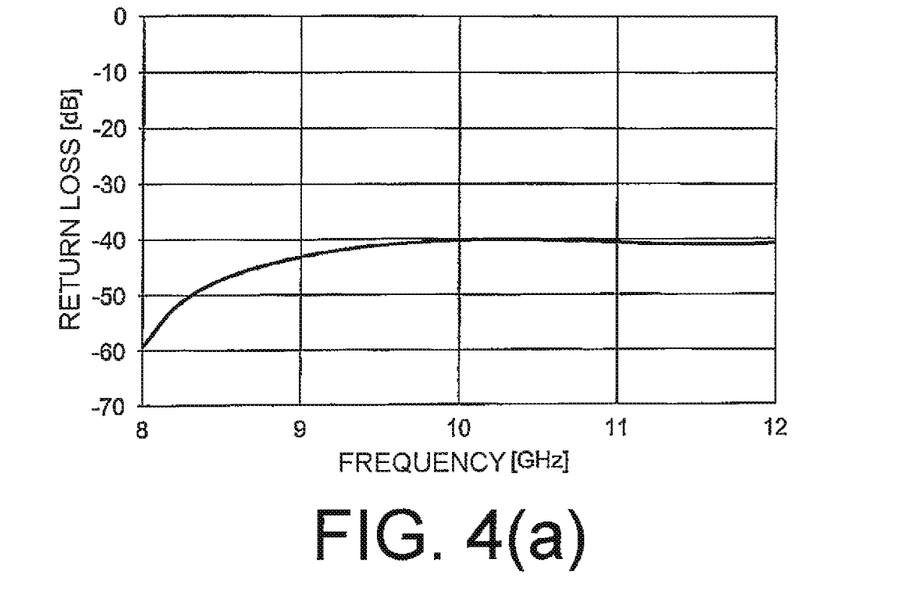
FIG. 4(a) and FIG. 4(b) are explanatory graphs for showing characteristics of one circuit structural body according to the embodiment of this invention.
Figure 4B:
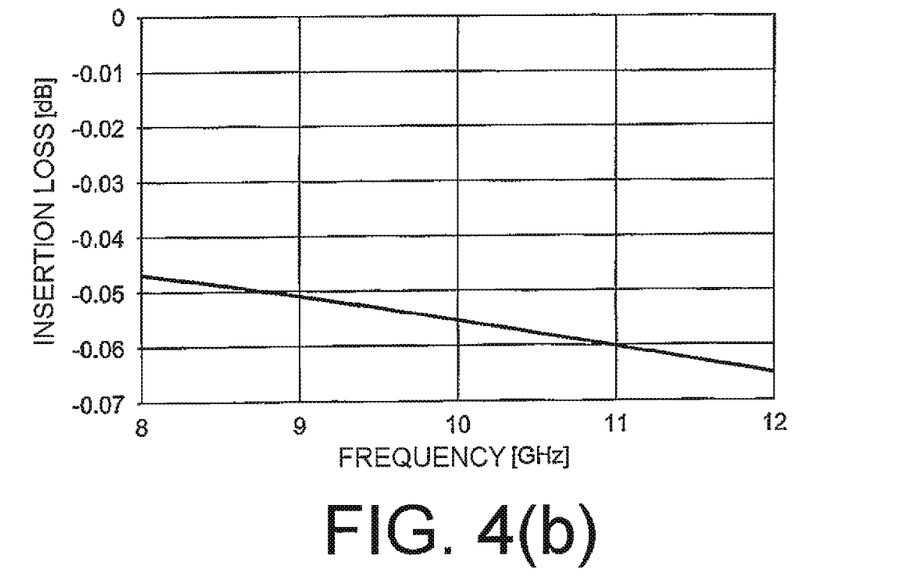

FIG. 4 (a) is a graph of return loss characteristics in dB vs. frequency in GHz and FIG. 4 (b) is a graph of insertion loss characteristics in dB vs. frequency in GHz, which are obtained by simulating the characteristics of the circuit structural body illustrated in FIG. 1(a) to FIG. 1(d). The condition of simulation is set to circuit dimensions of 15 mm×20 mm and ΔS=0.02.

In the characteristic graphs in FIGS. 4(a) and 4(b), the simulation results are shown under a condition that the thickness of each layer is set to 0.762 mm, and a distance between the interlayers connection conductor 3 formed in the multilayer board and the ground conductor 2 on the side surface is set to 0.765 mm. As shown in the characteristic graphs in FIGS. 4(a) and 4(b), good characteristics can be maintained.

Next, some possible modes of this invention are exemplified.

Figure 5A:
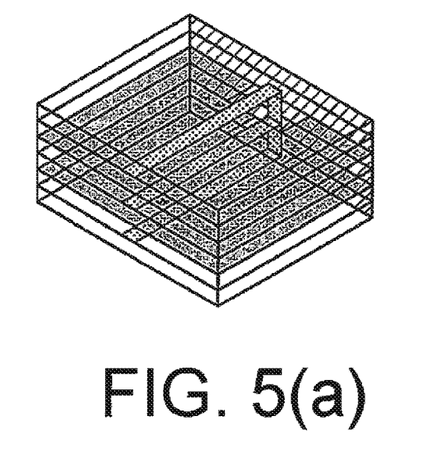
FIG. 5(a) and FIG. 5(b) are explanatory views for illustrating a circuit structural body according to still another embodiment of this invention.
Figure 5B:
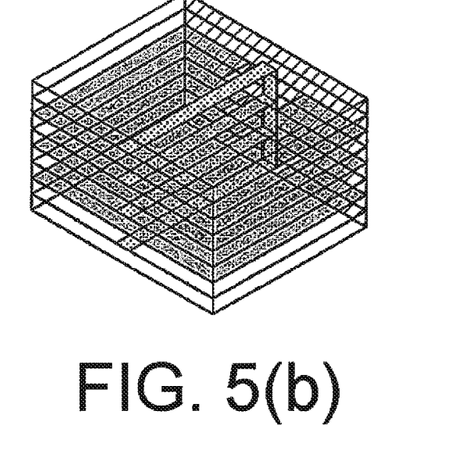

In FIG. 5(a) and FIG. 5(b), a modification example 1 of the circuit structure of this invention is illustrated.

A circuit structure illustrated in FIG. 5(a) is a mode in which a three-layer tri-plate structure is formed by increasing layers. A circuit structure illustrated in FIG. 5(b) is a mode in which a four-layer tri-plate structure is formed.

A plurality of planar conductors each being a stripline are provided to the different three layers or four layers of the multilayer board. Further, the interlayers connection conductor serving as the interlayers connection line connects the planar conductors in the three layers or the four layers to each other. Each component is formed into a shape that achieves the impedance matching in accordance with a branching direction or a joining direction of a desired high frequency signal.

Even when the number of layers of the tri-plate structures is further increased in this manner, this invention effectively works for size reduction. This structure can be employed for branching and joining of a high frequency transmission path usable in a phased-array antenna, for example.

Figure 6:
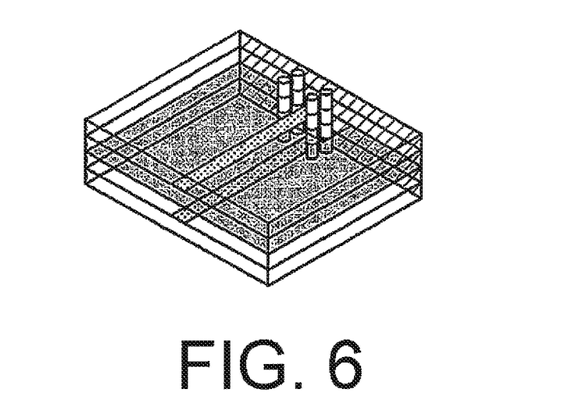
FIG. 6 is an explanatory view for illustrating a circuit structural body according to yet another embodiment of this invention.

FIG. 6 is a modification example 2 of the circuit structure of this invention.

In this circuit structure, two grounded through holes are formed on each of the side surface sides of the interlayers connection conductor 3. In this manner, there may be employed a circuit structure in which the desired number of through holes grounded to the side surface ground conductor 2 is provided around the interlayers connection conductor 3.

Further, there may be employed a shape in which a via grounded instead of the through hole is provided around the interlayers connection conductor 3 together with the side surface ground conductor 2.

Figure 7:
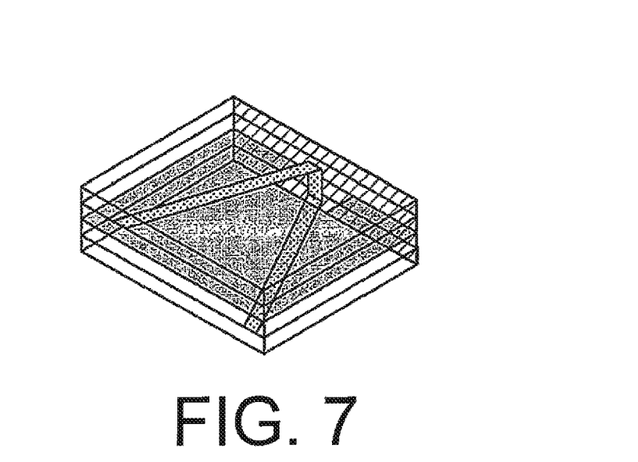
FIG. 7 is an explanatory view for illustrating a circuit structural body according to further embodiment of this invention.

FIG. 7 is a modification example 3 of the circuit structure of this invention.

In this circuit structure, the planar conductors serving as the tri-plate lines extend in different directions by layers. The circuit structure may be formed in this manner.

As described above, according to this invention, it is possible to provide the circuit structural body with the circuit structure which includes the plurality of planar conductors having the tri-plate structure in the different layers of the multilayer board and being connected to each other by the conductor, the circuit structural body occupying a small area and maintaining good circuit characteristics.

The specific configuration of this invention is not limited to the embodiments described above, and this invention encompasses changes made without departing from the gist of this invention. For example, each modification example described above can be incorporated into the circuit structure in combination as appropriate.

Accordingly, a part of or an entirety of the above-mentioned embodiments can also be described as follows. The following supplementary notes are not intended to limit this invention.

[Supplementary Note 1]

A circuit structural body, including:

a multilayer board serving as a multilayer tri-plate structural body and having a ground conductor surface and a strip conductor in respective layers;

an interlayers connection conductor serving as an interlayers connection line for connecting the strip conductors in different layers to each other; and a ground conductor having a positional relationship of being approximately parallel to the interlayers connection conductor and being formed on a side surface of the multilayer board that is near the interlayers connection conductor.

[Supplementary Note 2]

A circuit structural body as described in the above-mentioned Supplementary Note, in which the ground conductor surface excluding a portion corresponding to the interlayers connection conductor is formed on one layer sandwiched by the plurality of strip conductors of the multilayer board.

[Supplementary Note 3]

A circuit structural body as described in the above-mentioned Supplementary Notes, in which the ground conductor surface excluding a portion corresponding to the interlayers connection conductor is formed on one layer sandwiched by the plurality of strip conductors of the multilayer board.

[Supplementary Note 4]

A circuit structural body as described in the above-mentioned Supplementary Notes, in which a portion between the interlayers connection conductor and the ground conductor formed on the side surface of the multilayer board that is near the interlayers connection conductor is formed of a dielectric different from a base material of the multilayer board.

[Supplementary Note 5]

A circuit structural body as described in the above-mentioned Supplementary Notes, in which the portion between the interlayers connection conductor and the ground conductor formed on the side surface of the multilayer board near the interlayers connection conductor is formed of the dielectric having a dielectric constant higher than a dielectric constant of the base material of the multilayer board.

[Supplementary Note 6]

A circuit structural body as described in the above-mentioned Supplementary Notes, in which the portion between the interlayers connection conductor and the ground conductor formed on the side surface of the multilayer board near the interlayers connection conductor is formed of the dielectric having a dielectric constant lower than the dielectric constant of the base material of the multilayer board.

[Supplementary Note 7]

A circuit structural body as described in the above-mentioned Supplementary Notes, in which the portion between the interlayers connection conductor and the ground conductor formed on the side surface of the multilayer board near the interlayers connection conductor is formed of the dielectric different from the base material of the multilayer board, and in which, with the dielectric constant of the dielectric different from the base material of the multilayer board being a coefficient, a distance between the ground conductor formed on the side surface of the multilayer board and the interlayers connection conductor is set to a distance that achieves approximately equal distance and dielectric constant between the ground conductor and the strip conductor having the tri-plate structure formed in the multilayer board.

This invention can suitably be employed for a multilayer board that is required to save space or a multilayer board having a large number of layers, when forming the high frequency circuit structural body.

This application claims priority from Japanese Patent Application No. 2015-166912, filed on Aug. 26, 2015, the entire disclosure of which is incorporated herein by reference.

EXPLANATION OF REFERENCE SIGNS

1, 1' multilayer board
2 side surface ground conductor
3 interlayers connection conductor
4 a plurality of planar conductors

What is claimed is:

1. A circuit structural body comprising:
a multilayer board, which includes a plurality of layers of a first to N-th tri-plate structural bodies each including a respective first to N-th (N is an integer of 2 or more) planar conductors;
an interlayers connection conductor, which is configured to connect the first to N-th planar conductors to each other in an inner portion of the multilayer board; and
a side-surface ground conductor, which is formed on a side surface placed around the interlayers connection conductor of the multilayer board, and is approximately parallel to the interlayers connection conductor,
wherein the interlayers connection conductor connects the first to N-th planar conductors extended from the same side of the side-surface ground conductor,
wherein the portion between the interlayers connection conductor and the side-surface ground conductor of the multilayer board is formed by a dielectric,
wherein an n-th (1<n<N) tri-plate structural body is formed of an n-th tri-plate line including:
an n-th planar conductor; and an n-th parallel ground conductor and an (n+1)-th planar ground conductor sandwiching the n-th planar conductor therebetween,
wherein an m-th (2<m<N) planar ground conductor, which is provided between the first to N-th planar conductors, has a cutout through which the interlayers connection conductor is allowed to pass, the cutout having one side in contact with the side-surface grounding conductor,
wherein a portion between the interlayers connection conductor and the side-surface ground conductor is configured to operate as a transmission line of high frequency signals.

2. The circuit structural body according to claim 1, wherein the interlayers connection conductor is formed of a through hole.

3. The circuit structural body according to claim 1, wherein a distance between the side-surface ground conductor and the interlayers connection conductor is a distance smaller than half a distance between the m-th planar ground conductor and the (n+1)-th planar ground conductor.

4. The circuit structural body according to claim 1, wherein the interlayers connection conductor is formed of a planar conductor.

* * * * *